United States Patent [19]

Inasaka et al.

[11] Patent Number: 4,827,083
[45] Date of Patent: May 2, 1989

[54] WIRING SUBSTRATE

[75] Inventors: Jun Inasaka; Shin-Ichi Hasegawa, both of Tokyo, Japan

[73] Assignee: NEC Corporation, Tokyo, Japan

[21] Appl. No.: 180,585

[22] Filed: Apr. 7, 1988

Related U.S. Application Data

[63] Continuation of Ser. No. 2,935, Jan. 13, 1987, abandoned.

[30] Foreign Application Priority Data

Jan. 17, 1986 [JP] Japan ................................. 61-6358
Feb. 10, 1986 [JP] Japan ............................... 61-25934

[51] Int. Cl.4 ............................................. H05K 01/09
[52] U.S. Cl. .................... 174/68.5; 252/514; 361/411; 361/414
[58] Field of Search ............... 361/414, 411; 420/505; 174/68.5; 252/514

[56] References Cited

U.S. PATENT DOCUMENTS

| | | | |
|---|---|---|---|
| 3,030,237 | 4/1962 | Price | 117/227 |
| 4,001,146 | 1/1977 | Horowitz | 252/514 |
| 4,098,945 | 7/1978 | Oehmke | 428/327 |
| 4,419,279 | 12/1983 | Abrams | 252/514 |
| 4,552,691 | 11/1985 | Shoji et al. | 252/514 |
| 4,581,158 | 4/1986 | Lin | 252/511 |
| 4,639,830 | 1/1987 | Fukuoka | 361/411 |
| 4,663,189 | 5/1987 | Borland | 420/505 X |

OTHER PUBLICATIONS

Y. Shimada et al., "Low Firing Temperature Multilayer Glass-Ceramic Substrate", Proceedings 1983, 33rd Electronic Components Conference, IEEE and the Electronic Assn., pp. 344–349.

Primary Examiner—R. R. Kucia
Attorney, Agent, or Firm—Burns, Doane, Swecker & Mathis

[57] ABSTRACT

A wiring substrate which may be sintered with a minimum of cracking of the via-fills has a wiring substrate with wiring layers made of paste containing palladium powder and silver powder composed of spherical silver particles and flake-like silver particles, insulating layers made of a ceramic material and through-hole wirings formed by the paste within the insulating layers to provide electrical connection between the wiring layers.

3 Claims, 1 Drawing Sheet

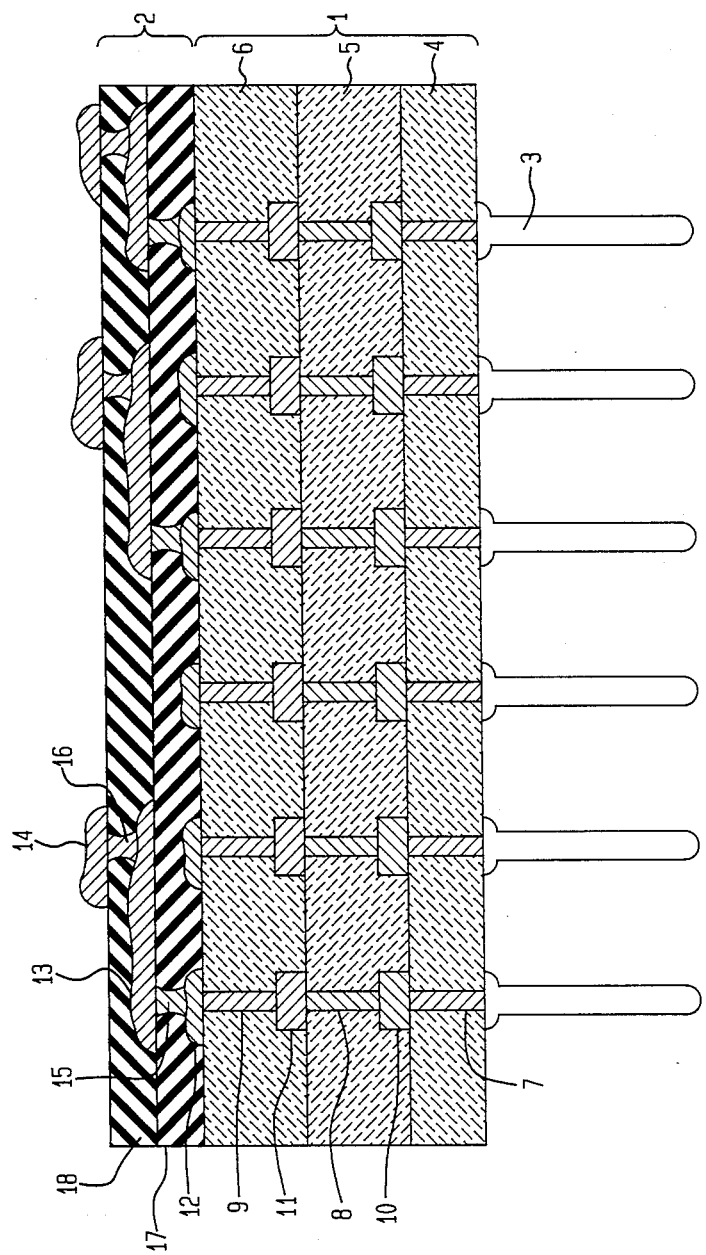

WIRING SUBSTRATE

This is a continuation of application Ser. No. 070,103 filed June 29, 1987 now abandoned.

BACKGROUND OF THE INVENTION

The present invention relates to a wiring substrate using a ceramic material as an insulating material thereof.

An example of prior art wiring substrates is disclosed on pages 344 to 349 of a paper entitled "LOW FIRING TEMPERATURE MULTILAYER GLASS-CERAMIC SUBSTRATE", by Y. Shimada et al published in the PROCEEDINGS 1983 33rd ELECTRONIC COMPONENTS CONFERENCE held by the IEEE and the ELECTRONIC INDUSTRIES ASSOCIATION. The substrate disclosed in the paper is manufactured by forming via-holes in a glass ceramic green sheet which constitutes an insulating layer, filling the via-holes with conductive paste, and sintering the green sheet and the paste filled in the via-holes. Although the conductive paste as taught by the paper is implemented with gold paste or silver-palladium alloy paste, the latter paste is more preferable than the gold paste from a cost standpoint. This paste contains silver powder whose particles are generally amorphous. When sintered, the paste containing the amorphous silver powder undergoes shrinkage by 25% to 30%, which is far greater than the shrinkage of a glass ceramic green sheet which is 12.5% to 13%. This brings about a problem that when paste containing such silver powder is used as a via-fill, cracks tend to be formed in the via-fill during sintering resulting in incomplete conduction. In addition, such paste has poor printing properties.

SUMMARY OF THE INVENTION

An object of the present invention is, therefore, to provide a wiring substrate free from the above-mentioned disadvantages of the prior art substrate.

According to an aspect of the invention, a wiring substrate has wiring layers made of paste containing palladium powder composed of spherical palladium particles and silver powder composed of spherical silver particles and flake-like silver particles; insulating layers made of a ceramic material for providing insulation between the wiring layers; and through-hole wirings formed by the paste within the insulating layers to provide electrical connection between the wiring layers.

BRIEF DESCRIPTION OF THE DRAWINGS

Other objects, features and advantages of the invention will become apparent from the following description when taken in conjunction with the accompanying drawing which is a cross-sectional view of an embodiment of the invention.

DESCRIPTION OF THE PREFERRED EMBODIMENT

Referring to the drawing, an embodiment of the invention comprises a ceramic layer section 1 and a wiring layer section 2. The section 1 is composed of laminated insulating layers 4 to 6, through-hole wirings 7 to 9 which are formed within the insulating layers 4 to 6, power supply wiring layers 10 and 11 connected to the through-hole wirings 7 to 9, power source terminals 3 attached onto the lower surface of the section 1 to feed power to the wiring layers 10 and 11 from the outside, and signal input/output terminals (not shown). The insulating layers 4 to 6 may be implemented with a mixture of alumina powder and lead borosilicate glass powder which can be sintered at about 900° C. (degrees centigrade), as described in the above-mentioned paper by Shimada et al. The section 2, on the other hand, has wiring patterns 12 made of gold or copper and provided on the upper surface of the section 1 by a thin-film technology well-known in the art, an insulating layer 17 so formed as to cover the upper surface of the section 1 and wiring patterns 12, wiring patterns 13 made of gold or copper and provided on the layer 17 by the thin-film technology, an insulating layer 18 so formed as to cover the layer 17 and the wiring patterns 13, a plurality of pads 14 provided on the layer 18 for connecting leads of an IC chip or like electronic component (not shown), via fills 15 formed within the insulating layer 17 to set up electrical connection between desired ones of the wiring patterns 12 and desired ones of the wiring patterns 13, and via fills 16 formed within the insulating layer 18 to provide electrical connection between desired ones of the wiring patterns 13 and desired ones of the pads 14. The section 2 may be formed by any suitable process such as shown in U.S. Pat. No. 4,569,876 by way of example.

While the section 1 may be produced by the method as described in the paper by Shimada et al, the material of the through-hole wirings 7 to 9 (via fills) and the wiring layers 10 and 11 is different from that disclosed in the paper. Specifically, in the embodiment, the conductive paste contains 85 to 95 wt% (percent by weight) of silver powder and 5 to 15 wt% of palladium. Further, the silver powder is a mixture of 50 to 95 wt% of flake-like silver particles and 5 to 50 wt% of spherical silver particles. Each of the spherical silver particles is formed within the range of 0.1 to 0.5μ (micron) in diameter, while each of the flake-like silver particles is formed within the range of 0.3 to 1.5 μm in width and length and within the range of 0.03 to 0.15μ in thickness. Using paste which contains 5 wt% of silver powder and 95 wt% of palladium powder, surface roughness and resistivity were measured against various mixture ratios of the flake-like silver particles and the spherical silver particles, as shown in Table below.

TABLE

| MIXTURE RATIO FLAKE-LIKE (wt %) SPHERICAL (wt %) | ROUGHNESS Ra(μ) | RESISTIVITY (μΩ · cm) |
| --- | --- | --- |
| 0/100 | 0.49 | 4.1 |
| 25/75 | 0.82 | 4.0 |
| 50/50 | 1.00 | 3.95 |
| 75/25 | 1.22 | 3.8 |
| 100/0 | 1.38 | 3.5 |

The conductive paste used in the embodiment is prepared as follows. First, silver powder containing the flake-like silver particles and the spherical silver particles each having the above-mentioned dimensions is selected by meshes. Further, palladium powder made up of spherical palladium particles whose diameter is 0.3 to 0.5μ is selected by a mesh. The two kinds of powder selected are mixed with an organic binder such as ethylcellulose or methylmetacrylate, and the resulting mixture is kneaded together at a temperature of about 30° C. and humidity of about 60% so that the silver powder and the palladium powder are mixed uniformly in the binder. Finally, a solvent such as ethylcarbitolacetate and a surface active agent are added to the kneaded mixture, whereby a silver-palladium alloy paste having adequate viscosity is produced. For a general method of producing paste, reference may be made to U.S. Pat. No. 4,362,656 and others.

The silver-palladium alloy paste produced by the above-mentioned procedure has a shrinkage ratio of about 13% which is substantially equal to that of a glass-ceramic green sheet and, hence, it is practically free from cracks and other undesirable occurrences otherwise caused by sintering. In addition, the surface of the paste sintered is smooth enough to prevent electromigration from occurring.

While the present invention has been described in conjunction with the embodiment thereof, it will now readily be possible for those skilled in the art to put the present invention into practice in various other manners.

What is claimed is:

1. A wiring substrate comprising:
   a plurality of wiring layers formed by sintering paste containing palladium powder composed of spherical palladium particles and silver powder composed of spherical silver particles and flake-like silver particles;
   a plurality of insulating layers formed by sintering a glass ceramic material for providing insulation between said wiring layers; and
   a plurality of through-hole wirings formed by said paste within said insulating layers to provide electrical connection between said wiring layers, wherein upon said sintering the shrinkage ratio of said paste is substantially equal to the shrinkage ratio of said glass ceramic material.

2. A wiring substrate as claimed in claim 1, wherein said silver powder contains 5 to 50 weight percent of said spherical silver particles and 50 to 95 weight percent of said flake-like silver particles, and wherein said paste contains 85 to 95 weight percent of said silver powder and 5 to 15 weight percent of said palladium powder.

3. A wiring substrate as claimed in claim 2, wherein said spherical palladium particles have a diameter of about $0.3\mu$ to about $0.5\mu$, said spherical silver particles have a diameter of about $0.1\mu$ to about $0.5\mu$, and said flake-like silver particles have a width and a length of about $0.3\ \mu m$ to about $1.5\ \mu m$ and a thickness of about $0.03\mu$ to about $0.15\mu$.

* * * * *